United States Patent
Zurowski et al.

(10) Patent No.: US 10,623,611 B2
(45) Date of Patent: Apr. 14, 2020

(54) ELECTRONIC HOUSING ASSEMBLY, ELECTRICAL CONNECTION AND ASSEMBLY METHOD

(71) Applicant: Delphi Technologies, LLC, Troy, MI (US)

(72) Inventors: Miroslaw J. Zurowski, Cracow (PL); Witold Poreda, Ruciane Nida (PL); Arkadiusz Rafalowski, Brzezinka (PL)

(73) Assignee: DELPHI TECHNOLOGIES, LLC, Troy, MI (US)

( * ) Notice: Subject to any disclaimer, the term of this patent is extended or adjusted under 35 U.S.C. 154(b) by 0 days.

(21) Appl. No.: 15/985,137

(22) Filed: May 21, 2018

(65) Prior Publication Data
US 2018/0352120 A1    Dec. 6, 2018

(30) Foreign Application Priority Data

Jun. 1, 2017    (FR) ...................................... 17 54882

(51) Int. Cl.
| | |
|---|---|
| *H04N 5/225* | (2006.01) |
| *G03B 17/55* | (2006.01) |

(Continued)

(52) U.S. Cl.
CPC ........... *H04N 5/2252* (2013.01); *G03B 17/55* (2013.01); *H01R 12/585* (2013.01); *H01R 13/424* (2013.01); *H04N 5/2253* (2013.01); *H04N 5/2254* (2013.01); *H05K 1/0278* (2013.01); *H05K 1/118* (2013.01); *H05K 1/144* (2013.01); *H05K 1/147* (2013.01); *H05K 1/189* (2013.01); *H05K 5/0004* (2013.01);
(Continued)

(58) Field of Classification Search
CPC .. H04N 5/2252; H04N 5/2254; H05K 5/0026; H05K 5/069; H05K 1/189; G03B 17/55
See application file for complete search history.

(56) References Cited

U.S. PATENT DOCUMENTS 6,151,065 A  *  11/2000  Steed .................. B60Q 1/0023
                                                 348/148
9,668,388 B2     5/2017  Caclard
(Continued)

FOREIGN PATENT DOCUMENTS

| CN | 2766378 Y | 3/2006 |
|---|---|---|
| CN | 104247587 A | 12/2014 |

(Continued)

*Primary Examiner* — Ahmed A Berhan
(74) *Attorney, Agent, or Firm* — Joseph V. Bonadies

(57) ABSTRACT

An electronic housing assembly comprises a printed circuit board comprising a rigid main part, at least one face of which part includes an electronic component, and comprising at least one flexible part positioned at the periphery of the rigid part, the flexible part comprising at least one electrical connection pad; an upper housing element comprising a first cylindrical wall that is inserted into a lower housing element comprising a second cylindrical wall; the flexible part extending between the first and the second cylindrical walls, the electrical connection pad of the flexible part being in electrical contact with an electrical contact surface that is positioned on the outer face of the first cylindrical wall or on the inner face of the second cylindrical wall.

20 Claims, 11 Drawing Sheets

(51) Int. Cl.
*H05K 5/00* (2006.01)
*H05K 5/06* (2006.01)
*H05K 1/14* (2006.01)
*H01R 43/20* (2006.01)
*H05K 1/11* (2006.01)
*H01R 12/58* (2011.01)
*H01R 13/424* (2006.01)
*H05K 1/02* (2006.01)
*H05K 1/18* (2006.01)
*B60R 1/00* (2006.01)

(52) U.S. Cl.
CPC ........... *H05K 5/0026* (2013.01); *H05K 5/069* (2013.01); *B60R 1/00* (2013.01); *B60R 2300/10* (2013.01); *H05K 1/184* (2013.01); *H05K 2201/042* (2013.01); *H05K 2201/10121* (2013.01)

(56) References Cited

U.S. PATENT DOCUMENTS

| | | | |
|---|---|---|---|
| 10,209,512 | B2 | 2/2019 | Bulgajewski et al. |
| 2006/0171704 | A1* | 8/2006 | Bingle .................... B60R 11/04 396/419 |
| 2012/0170119 | A1 | 7/2012 | Chu et al. |
| 2014/0060582 | A1 | 3/2014 | Hartranft et al. |

FOREIGN PATENT DOCUMENTS

| | | |
|---|---|---|
| CN | 204088590 U | 1/2015 |
| CN | 206005055 U | 3/2017 |
| CN | 107810444 A | 3/2018 |
| DE | 10 2015 116962 A1 | 4/2017 |
| WO | 2016/164173 A1 | 10/2016 |

* cited by examiner

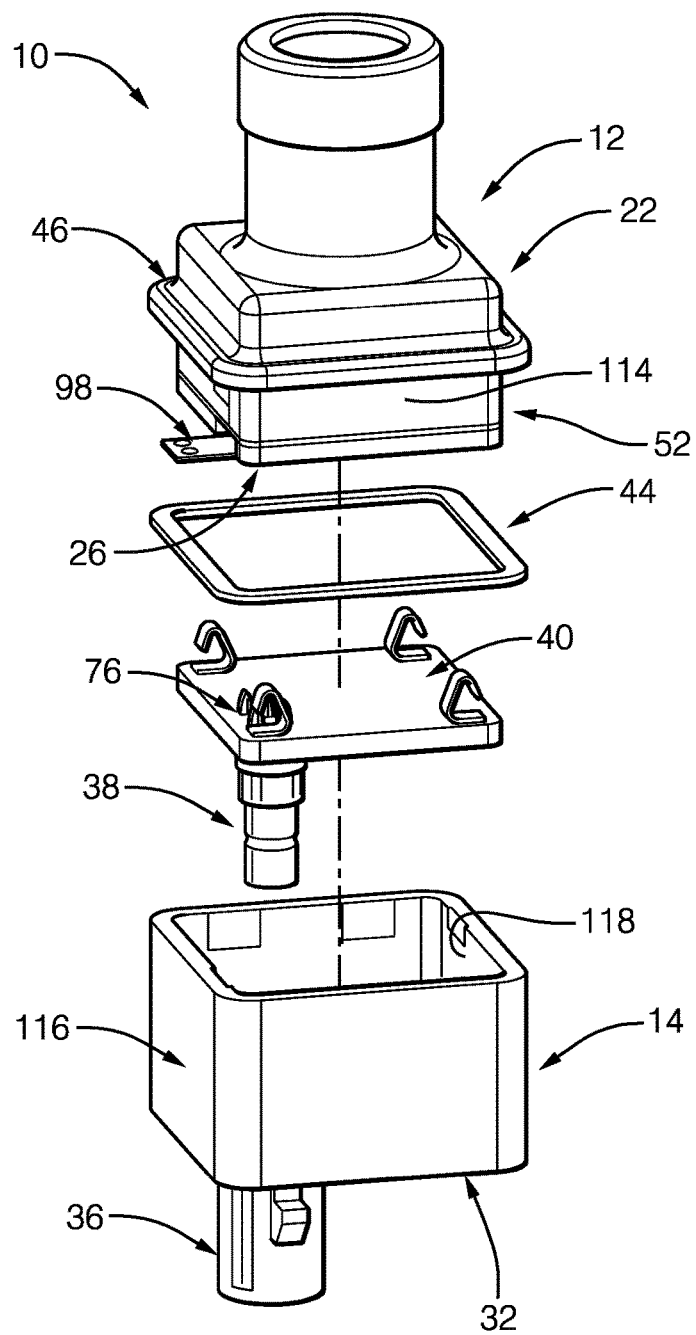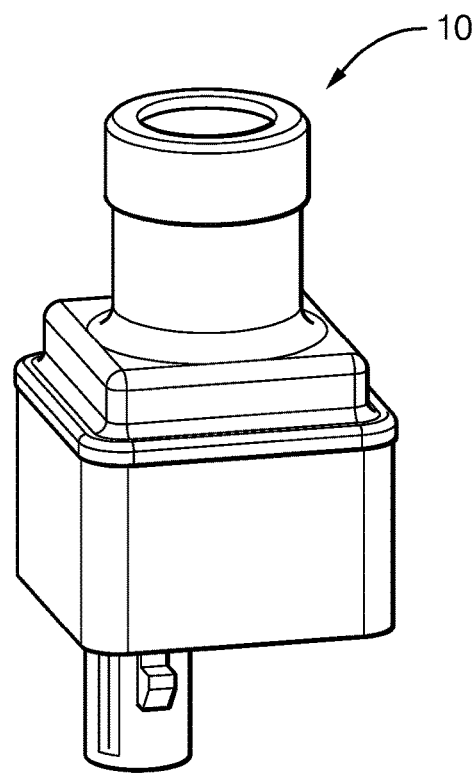
FIG. 19
FIG. 20

ELECTRONIC HOUSING ASSEMBLY, ELECTRICAL CONNECTION AND ASSEMBLY METHOD

TECHNICAL FIELD OF INVENTION

The present invention relates to an electronic housing assembly and to its electrical connection to a printed circuit board.

BACKGROUND OF INVENTION

Electronic units for motor vehicles that are positioned outside the vehicles are subjected to environmental stresses such as cold and ice. In order that they are not subjected to lasting effects of these stresses, these electronic units are generally equipped with electrical devices that make it possible to clear the effects of these stresses. There may be found, for example, electronic units equipped with electrical devices such as for example heating elements to combat frost. These electrical devices are generally controlled by way of wiring harnesses and connectors linking an electronic control board to the electrical devices. The current solutions for the electrical connection of these electrical devices are bulky, expensive and cumbersome.

SUMMARY OF THE INVENTION

According to the invention, an electronic housing assembly comprises a printed circuit board comprising a rigid main part, at least one face of which part includes an electronic component, and comprising at least one flexible part positioned at the periphery of the rigid part, the flexible part comprising at least one electrical connection pad; an upper housing element comprising a first cylindrical wall that is inserted into a lower housing element comprising a second cylindrical wall. The flexible part extends between the first and the second cylindrical walls, and the electrical connection pad of the flexible part is in electrical contact with an electrical contact surface that is positioned on the outer face of the first cylindrical wall or on the inner face of the second cylindrical wall.

The flexible part may be formed by a flexible tab that extends overall in the plane of the main part of the printed circuit board before mounting of the printed circuit board in the electronic housing assembly.

The flexible part may be formed by a thinned part of the substrate that forms the main part of the printed circuit board.

The main part of the printed circuit board may be attached to a free end edge of the first cylindrical wall and may extend in a plane substantially transverse to the vertical axis of the first cylindrical wall.

The first and the second cylindrical walls may each include at least one substantially flat electrical contact surface and the flexible part may be held in a manner pinched between said flat contact surfaces.

The electrical connection pad of the flexible part is curved in form, so as to reinforce the electrical contact between the electrical connection pad of the flexible part and the electrical contact surface of the associated cylindrical wall.

The upper housing element may include a lens holder, and the main part of the printed circuit board may include an electronic image-capturing circuit.

The electrical contact surface that is positioned on the outer face of the first cylindrical wall may be linked electrically to an electrical device, such as a heating device, that is positioned on the lens holder.

According to the invention, a method for assembling an electronic housing assembly such as described above includes the following steps: providing a printed circuit board comprising a rigid main part and comprising at least one flexible part; attaching the main part of the printed circuit board to a free end edge of the first cylindrical wall of an upper housing element in a plane substantially transverse to the axis of the first cylindrical wall; sliding the first cylindrical wall into a lower housing element and against the second cylindrical wall of the lower housing element, so as to bend the flexible part vertically; and inserting the first cylindrical wall into the lower housing element and against the second cylindrical wall of the lower housing element, so as to pinch the flexible part between the first and the second cylindrical walls.

Other aims and advantages of the present invention will emerge in the light of the following description.

BRIEF DESCRIPTION OF DRAWINGS

Other features, aims and advantages of the invention will emerge upon reading the following detailed description, and with reference to the appended drawings, given by way of nonlimiting example and in which:

FIG. 19 is a schematic, perspective and partially exploded view of the electronic housing assembly of the invention, illustrating a method for assembling the electronic housing assembly; and FIG. 20 is a schematic and perspective view of the electronic housing assembly in assembled form.

DETAILED DESCRIPTION

Figure 1:
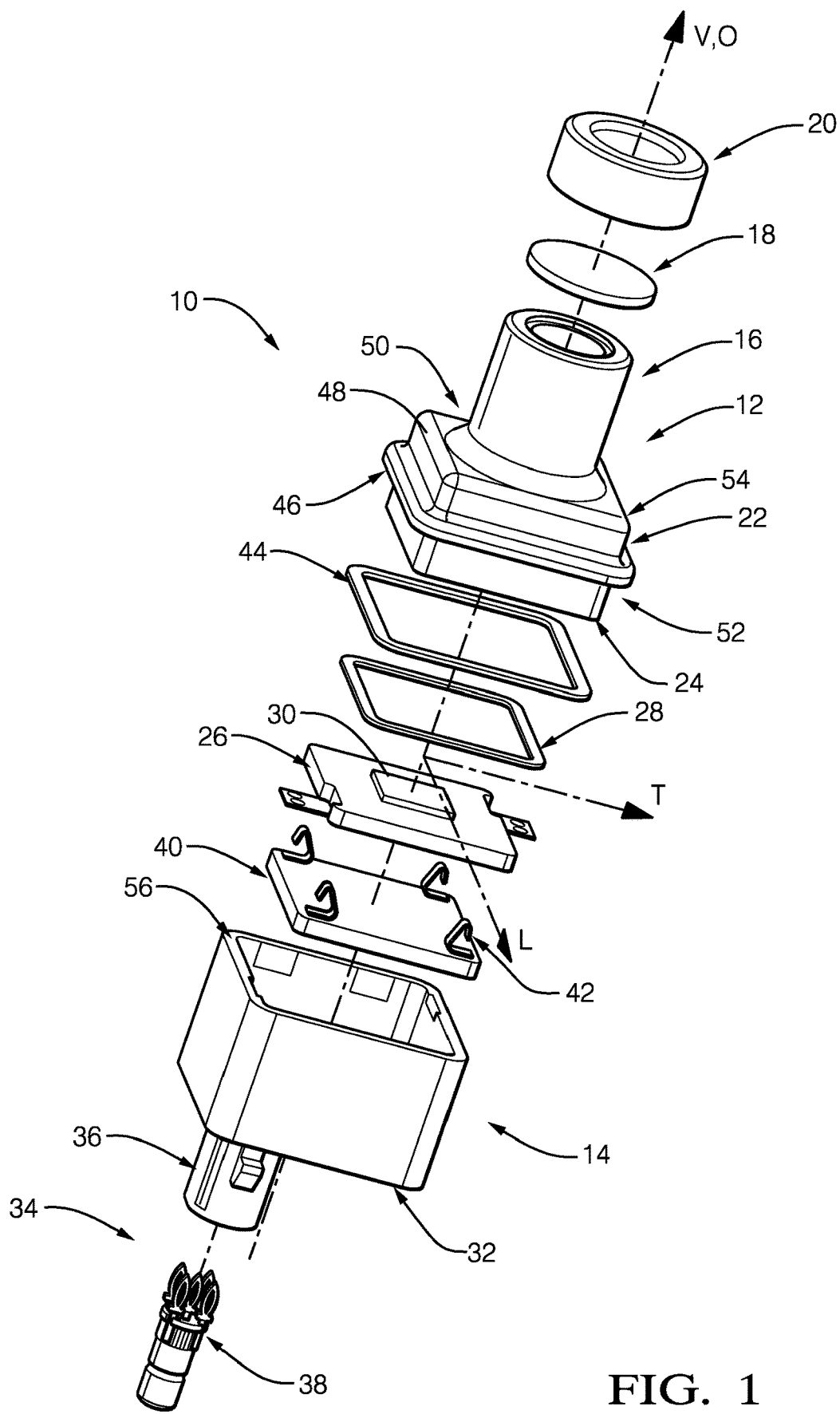
FIG. 1 is a schematic, perspective and exploded view of the electronic housing assembly according to the invention.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for describing embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

In order to facilitate the description, and in a nonlimiting manner, an orthogonal reference frame, comprising a longitudinal axis L, a transverse axis T and a vertical axis V, is defined. Orientations 'low', 'high', 'top', 'bottom', 'lower' and 'upper' are defined in the vertical direction. Orientations 'left', 'right' and 'lateral' are defined in the transverse direction. Orientations 'front' and 'rear' are also defined in the longitudinal direction.

Figure 2:
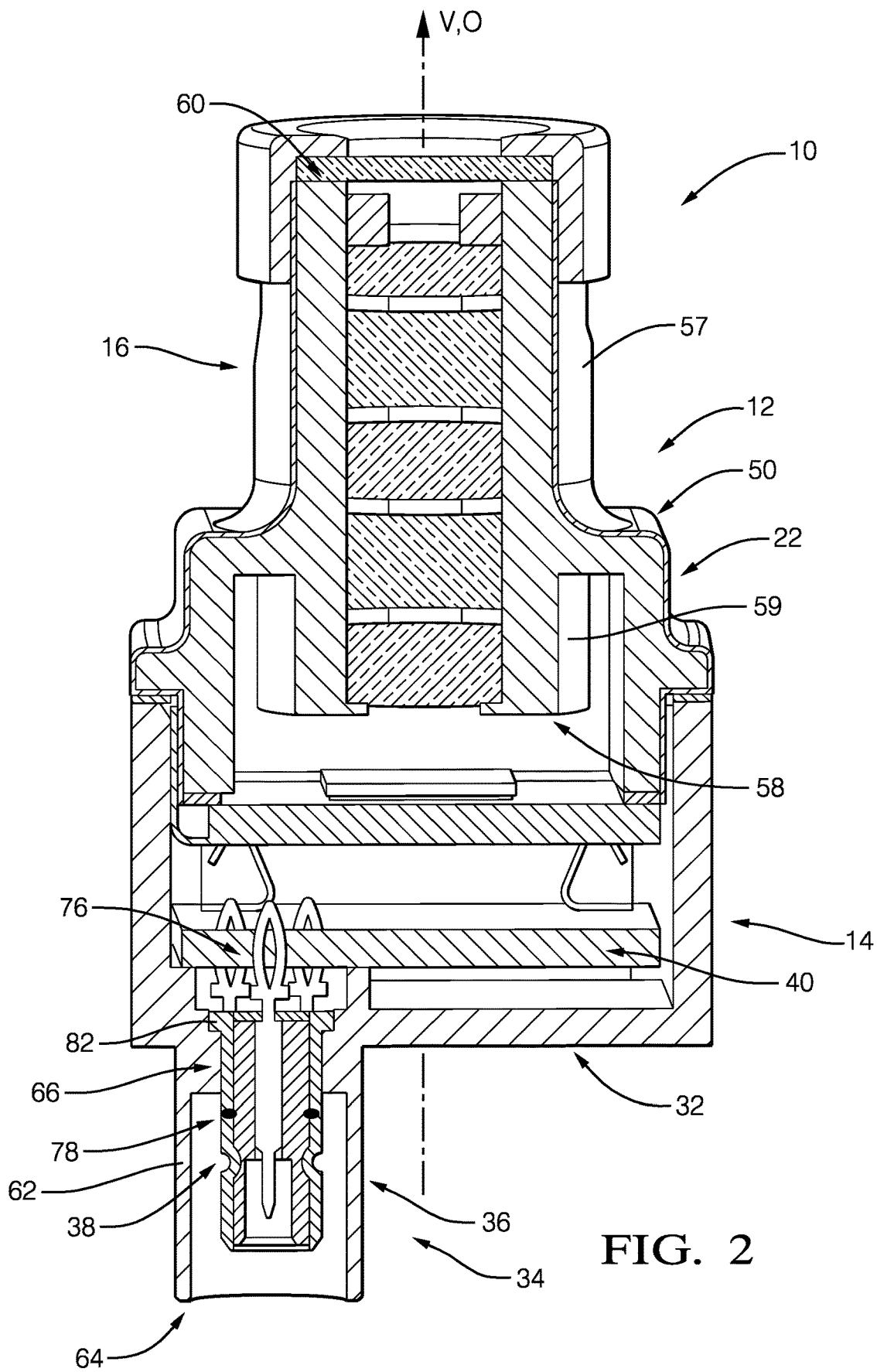
FIG. 2 is a schematic, perspective and cross-sectional view of the electronic housing assembly of FIG. 1 in assembled form.

FIG. 1 and FIG. 2 show an electronic housing assembly 10 forming an optical device, and more particularly forming a camera for a vehicle. This type of camera is intended to be mounted outside the vehicle, and therefore to be subjected to the conditions outside the vehicle, such as the weather.

In FIG. 1, the electronic housing assembly 10 comprises an upper housing 12 and a lower housing 14.

The upper housing 12 includes a tubular lens holder 16 extending along the vertical axis V, topped by a protective outer lens 18 held on the lens holder 16 by a holding cover 20. The upper housing 12 also includes a cylindrical base 22, also extending along the vertical axis V and comprising an upper end wall 50 and an open bottom free end 24; a first printed circuit board 26 being intended to be attached to the bottom end 24, transverse to the cylindrical wall 48 of the base 22, by way of a first adhesive seal 28, so as to hermetically close off the upper housing 12.

The first printed circuit board 26 comprises an electronic image-capturing circuit 30 that is aligned with the lenses along the optical axis O of the electronic housing assembly 10.

The lower housing 14 is of hollow cylindrical form with a rectangular base. The lower housing 14 includes a housing bottom 32 comprising a connector 34. The connector 34 comprises a connector body 36 integral with the lower housing 14, and also a set of electrical terminals 38 intended to be inserted into the body of the connector 36 and intended to be in electrical contact with a second printed circuit board 40.

The second printed circuit board 40 includes means 42 for making electrical connection to the first printed circuit board 26; more particularly, the electrical connection means 42 are formed by flexible tabs attached to the second printed circuit board 40 and in contact with the first printed circuit board 26 through compression.

The upper housing 12 is attached to the lower housing 14 by way of a second adhesive seal 44. More particularly, the base 22 of the upper housing 12 comprises an outer cylindrical rim 46 positioned on the outer surface of the cylindrical wall 48 of the base 22 of the upper housing 12. The rim 46 is positioned between the upper end wall 50 and the bottom end 24 of the base 22, so as to define a top portion 54 and bottom portion 52 of the base 22 of the upper housing 12. The bottom portion 52 of the base 22 is inserted into the lower housing 14 until the rim 46 of the base 22 of the upper housing 12 comes into abutment against the second adhesive seal 44 positioned on the upper surface of the top end 56 of the lower housing 14. The upper surface of the top end 56 of the lower housing 14 thus forms a bearing surface.

As an alternative, the bearing surface of the lower housing may be positioned somewhere other than on the top end 56 of the lower housing 14. By way of example, the bearing surface may be formed by a rim inside the inner surface 118 of the cylindrical wall 116 of the lower housing 14.

Optionally, the second adhesive seal 44 may be formed by depositing adhesive onto the upper surface of the top end 56 of the lower housing 14, or else onto the rim 46 of the base 22 of the upper housing 12.

In greater detail and in FIG. 2, the upper end wall 50 of the base 22 of the upper housing 12 is passed through by the tubular lens holder 16. The lens holder 16 extends along the optical axis O of the electronic housing assembly 10 from its first end positioned inside the base 22 as far as its second end 60 positioned outside the upper end wall 50 of the base 22. That part of the lens holder 16 positioned inside the base 22 defines a lower section 59 of the lens holder 16, and that part of the lens holder 16 positioned outside the base 22 defines an upper section 57 of the lens holder 16. The lens holder 16 that is shown comprises four lenses that are regularly spaced apart overall. This arrangement allows a multi-lens structure while at the same time minimizing the length, along the optical axis O, of the electronic housing assembly 10.

Figure 3:
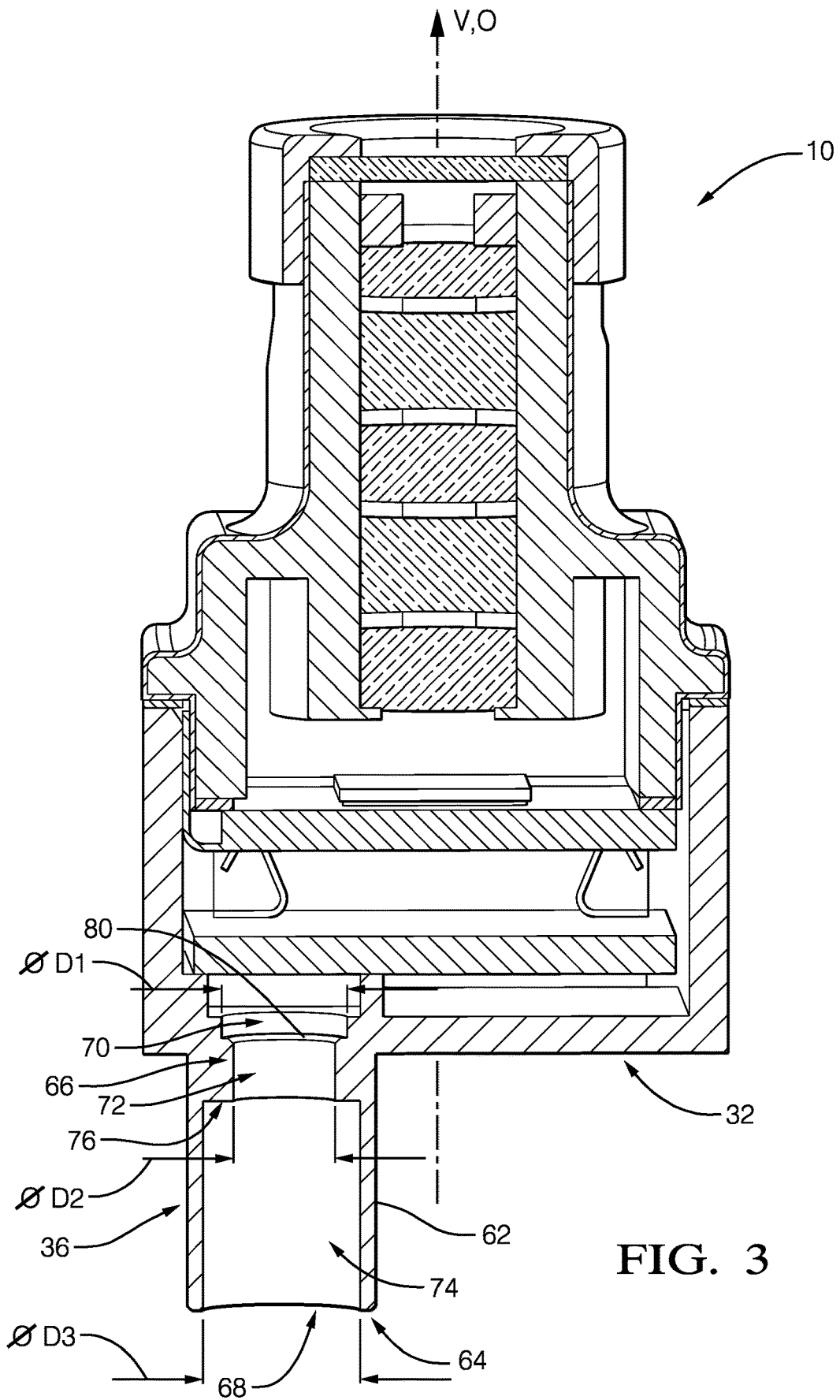
FIG. 3 is a schematic, perspective and cross-sectional view of the electronic housing assembly of FIG. 1 in assembled form, in which the body of the connector is shown without the set of electrical terminals.

In FIG. 2 and FIG. 3, the body of the connector 36 comprises a cylindrical wall 62 with a circular base extending vertically from the outer face of the housing bottom 32 as far as its free end 64 and a portion 66 hollowed out of the thickness of the housing bottom 32. The body of the connector 36 comprises a cylindrical cavity 68 with a circular base comprising three sections that have different diameters and are in continuity with one another. The cavity with three sections makes it possible to position the set of electrical terminals in a fixed manner.

The first section 70 is hollowed out overall from the inner surface of the wall of the housing bottom 32 as far as halfway through the thickness of the wall of the housing bottom 32. The first section 70 is a cylindrical section with a circular base comprising a first diameter D1. The second section 72, in continuity with the first section 70, forms a cavity with a second diameter D2, slightly smaller than the first diameter D1. The second section 72 extends overall from midway through the thickness of the wall of the housing bottom 32 as far as its end 76 outside the housing wall 32. The third section 74, in continuity with the second section 72, comprises a third diameter D3, greater both than the second diameter D2 and than the first diameter D1.

The set of electrical terminals 38 comprises an upper part formed of electrical contacts 76 that are inserted into the second printed circuit board 40, and a second cylindrical part, forming the base 78 of the set of electrical terminals 38. More precisely, the electrical contacts 76 are forcibly inserted into the second printed circuit board 40, thus enabling electrical contact between the connector 34 and the second printed circuit board 40.

The difference between the first diameter D1 and the second diameter D2 makes it possible, at the junction between the first section 70 and the second section 72 of the cavity 68 of the connector body 36, to form a step or cylindrical rim 80 on which an upper rim 82 of the base 78 of the set of electrical terminals 38 bears. In the embodiment that is shown, the upper rim 82 of the base 78 of the set of electrical terminals 38 is positioned at the upper end of the base 78.

The diameter D2 of the second section 72 is also adjusted such that the part of the base 78 of the set of electrical terminals 38 in continuity with the upper rim 82 of the base 78 of the set of electrical terminals 38 is inserted with friction against the inner wall of the second section 72, so as not to be able to pivot laterally.

The base 78 of the set of electrical terminals 38 lastly comprises a bottom end positioned in the third cavity 74 so as to enable the set of electrical terminals 38 to be coupled electrically to a complementary electrical terminal inserted into the third cavity 74.

Figure 4:
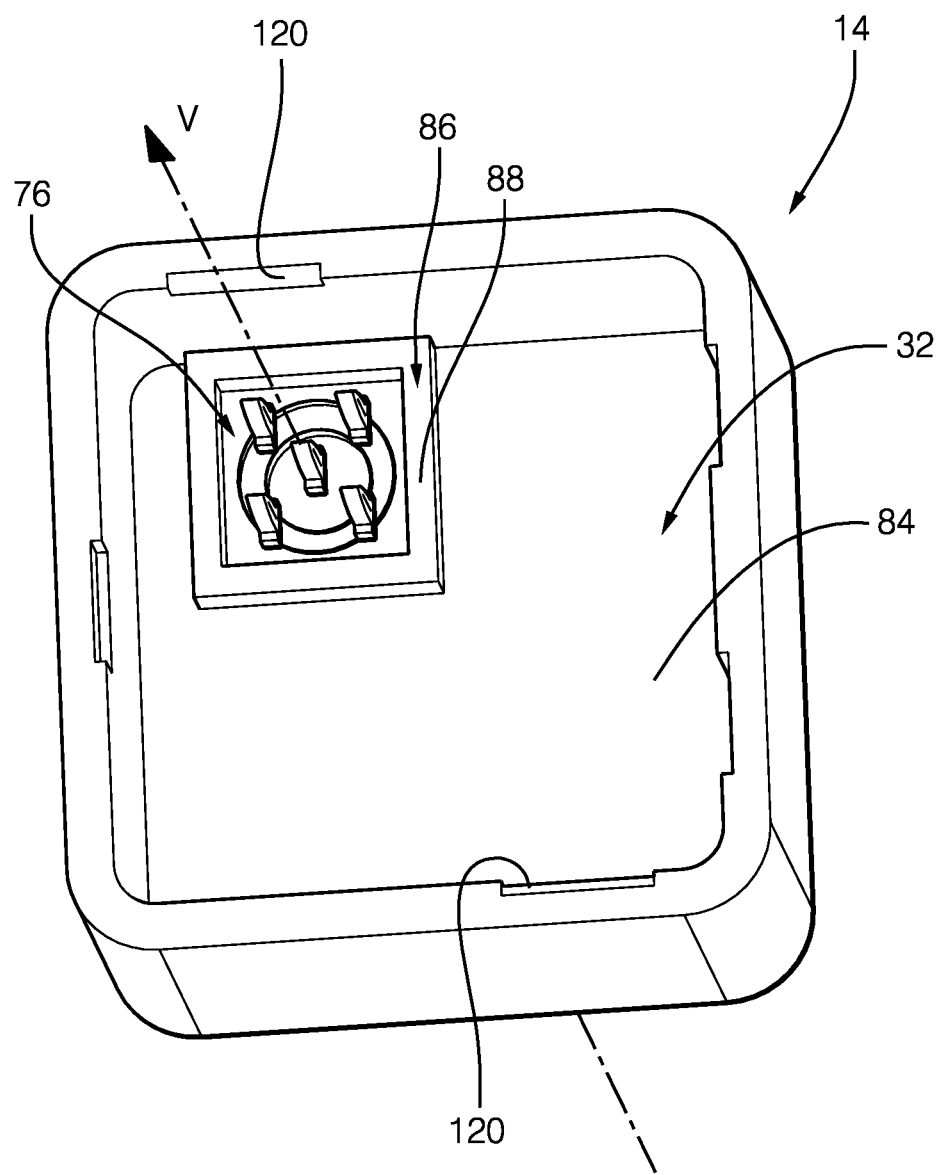
FIG. 4 is a schematic and perspective view of the lower housing, and of its housing bottom, of the electronic housing assembly of FIG. 1, the housing bottom being shown with the electrical contacts of the set of electrical terminals.

In FIG. 4, the inner face 84 of the housing bottom 32 also comprises a cylindrical wall 86 with a rectangular base inside the lower housing 14 and surrounding the electrical contacts 76 of the set of electrical terminals 38. The cylindrical wall 86 inside the lower housing 14 has a height, along the vertical axis V, less than the electrical contacts 76 that are intended to be inserted into the second printed circuit board 40, so as to enable the second printed circuit board 40 to bear on the upper end 88 of the cylindrical wall 86 inside the lower housing 14.

Holding of the second printed circuit board 40 in the housing bottom 32 is therefore made possible by assembling the electrical contacts 76 in the second printed circuit board 40, by positioning the base 78 of the set of electrical terminals 38 in the cavity 68 of the connector body 36 and by positioning the second printed circuit board 40 against the upper end 88 of the cylindrical wall 86 inside the lower housing 14.

Figure 5:
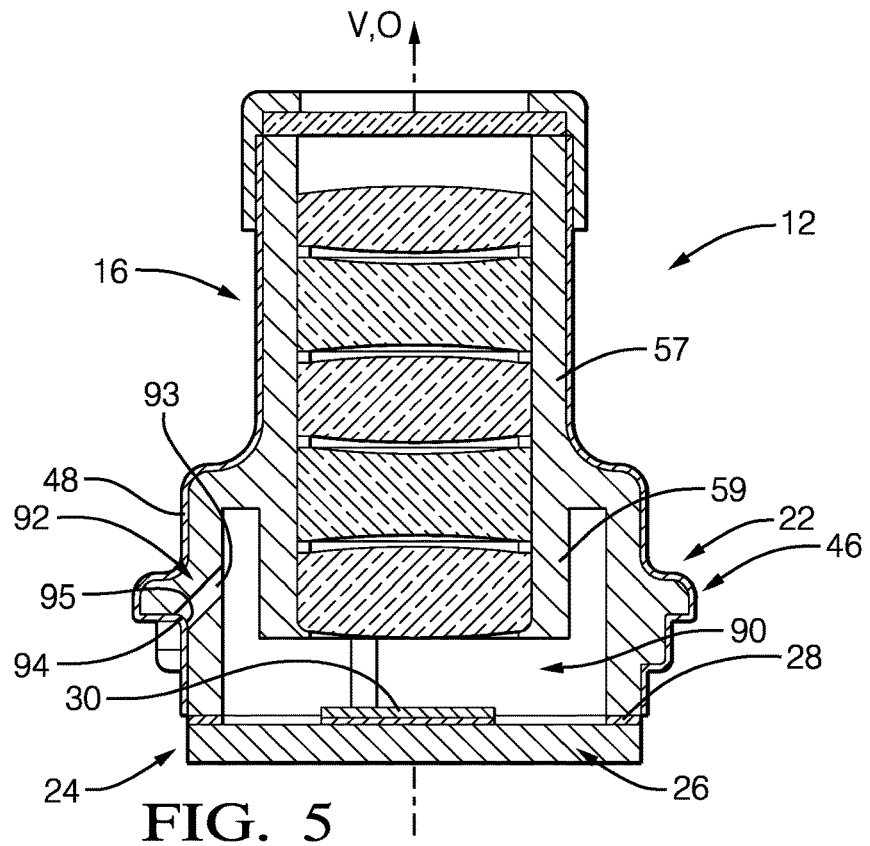
FIG. 5 is a schematic, perspective and cross-sectional view of the upper housing assembled with the first printed circuit board, the cross section making it possible to view the conduit of the upper housing.

In FIG. 5, the upper housing 12 is shown closed off at the bottom end 24 of the base 22 by the first printed circuit board 26 by way of the first adhesive seal 28, thus forming a cavity 90 inside the upper housing 12. More precisely, the cavity 90 inside the base 22 of the upper housing 12 is the free space delimited by the cylindrical wall 48 of the base 22 and the first printed circuit board 26, whereas a space inside the cylindrical base 22 is taken up by the lower section 59 of the tubular lens holder 16 positioned inside the base 22.

A conduit 92 is positioned in a manner opening firstly onto the inner face of the cylindrical wall 48 of the base 22, through an inner orifice 93, and secondly at the junction 94 between the outer face of the cylindrical wall 48 of the base 22 and the lower surface of the rim 46 of the base 22, through an outer orifice 95, so as to allow the air compressed in the cavity 90 to be evacuated outside the upper housing 12 when the upper housing 12 is assembled with the first printed circuit board 26.

Specifically, during the process of assembling the first printed circuit board 26 with the bottom end 24 of the base 22 of the upper housing 12, the air is compressed in the cavity 90. The volume of air increases in particular when the first adhesive seal 28 is heated so as to ensure that it adheres between the first printed circuit board 26 and the base 22 of the upper housing 12. The increase in the volume of air, or equally the compression thereof in the cavity 90, may lead to movement of the lenses of the lens holder 16, and therefore corrupt the initial alignment of the lenses with the electronic image-capturing circuit 30.

The conduit 92 therefore makes it possible to eliminate the risk of misalignment between the lenses and the electronic image-capturing circuit 30.

Optionally, the first adhesive seal 28 may be formed by depositing adhesive onto the lower face of the bottom end 24 of the base 22 of the upper housing 12, or by depositing adhesive onto the perimeter of the first printed circuit board 26.

Figure 6:
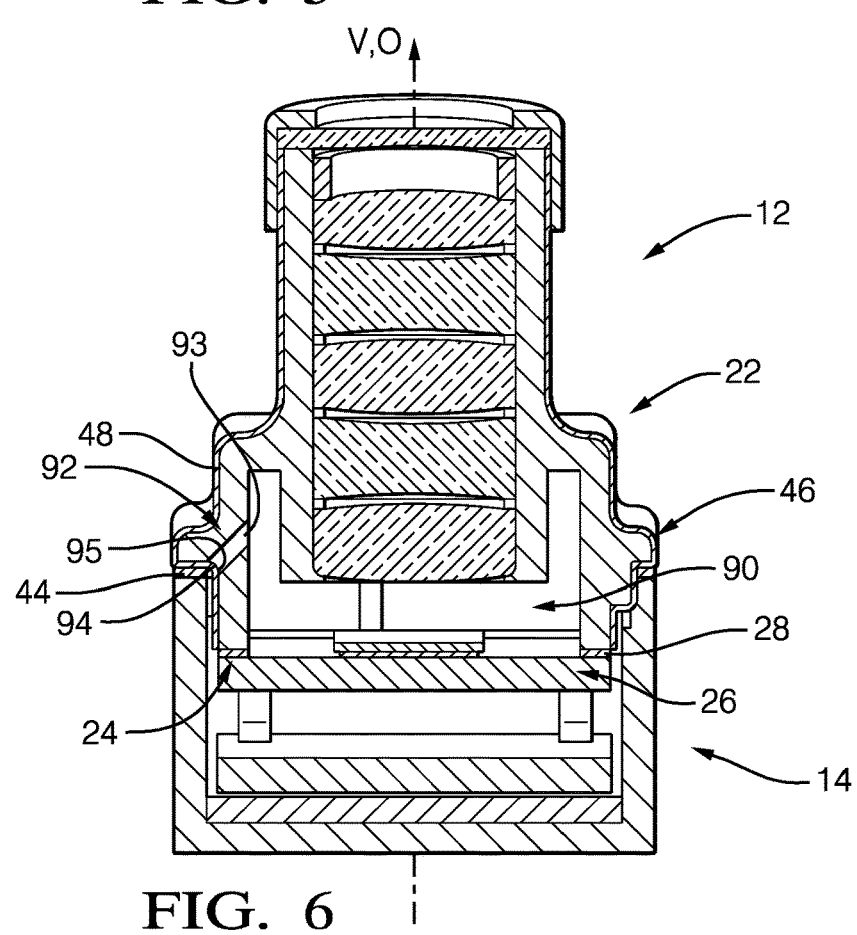
FIG. 6 is a schematic, perspective and cross-sectional view of the upper housing of FIG. 5 assembled with the lower housing of the electronic housing assembly of the invention.

It should be noted that, in FIG. 6, when assembling the upper housing 12 with the lower housing 14, the outer orifice 95 of the conduit 92, opening onto the junction 94 between the outer face of the cylindrical wall 48 of the base 22 and the lower surface of the rim 46 of the base 22, is plugged by the second adhesive seal 44, making the inner cavity 90 of the upper housing 12 hermetically sealing.

So as to easily position the outer orifice 95 of the conduit 92, the conduit 92 is hollowed out obliquely downwards with respect to the optical axis O from the inner orifice 93 to the outer orifice 95.

Figure 7:
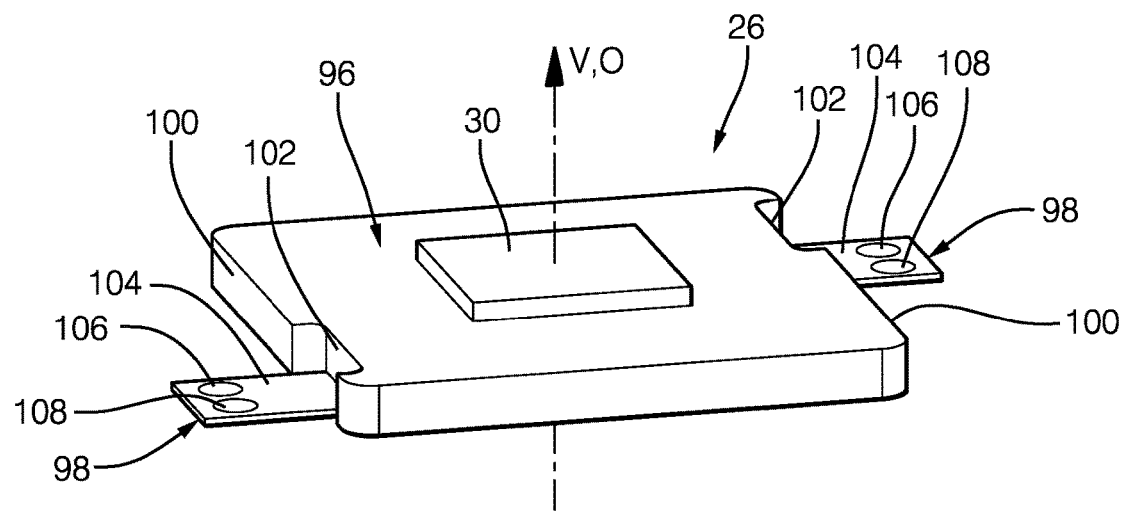
FIG. 7 is a schematic and perspective view of the upper face of the first printed circuit board of the electronic housing assembly of FIG. 1.
Figure 8:
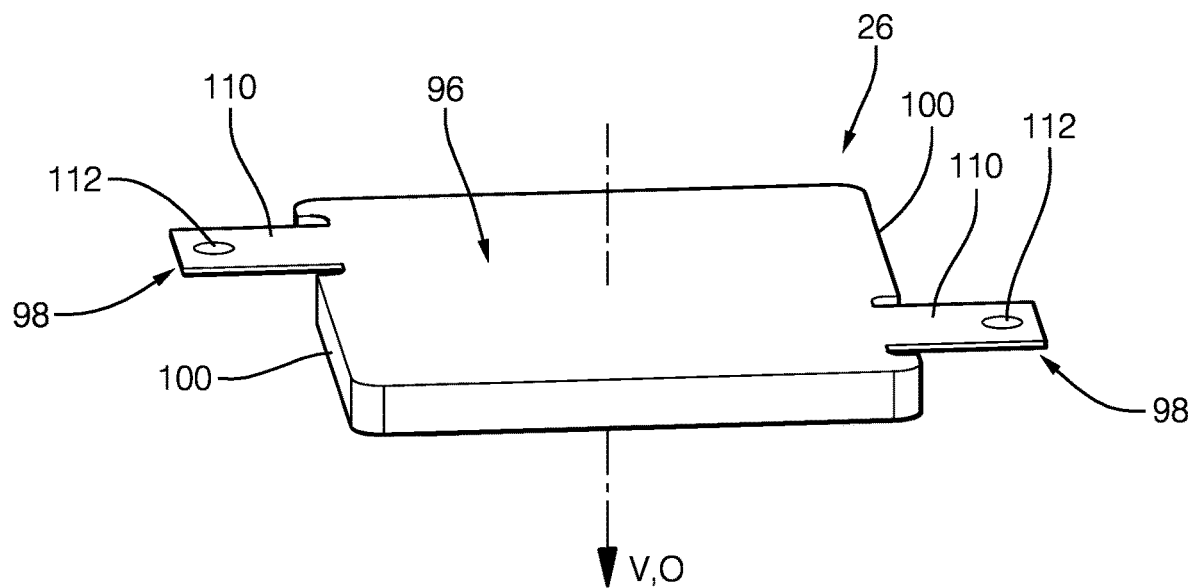
FIG. 8 is a schematic and perspective view of the lower face of the first printed circuit board of the electronic housing assembly of FIG. 1.

In FIG. 7 and FIG. 8, the first printed circuit board 26 is shown before complete assembly of the electronic housing assembly 10, that is to say before assembly of the upper housing 12, the bottom end 24 of the base 22 of which housing is closed off by the first printed circuit board 26, with the lower housing 14. The upper housing 12 and the lower housing 14 are made of conductive metal. The first printed circuit board 26 comprises a rigid main part equipped with the electronic image-capturing circuit 30 and two flexible parts 98 that are positioned on either side of the rigid part 96. This type of printed circuit board is commonly called a rigid-flex printed circuit board. The flexible part 98 generally comprises a substrate that is thinned with respect to the substrate of the rigid part 96. The flexible part 98 generally comprises a plastic substrate on which conductive tracks are positioned. The flexible part 98 is generally formed by a flexible tab that extends overall in the plane of the rigid part of the printed circuit board before assembly thereof in the electronic housing assembly 10. The rigid part 96 of the first printed circuit board 26 is rectangular overall. Each flexible part 98 is positioned on a lateral edge 100 of the rigid part 96. More particularly, the end at which the rigid part 96 joins each flexible part 98 is positioned in a notch 102 formed on each lateral edge 100 of the rigid part 96 of the first printed circuit board 26.

Each flexible part 98 comprises, on its upper face 104, a first and a second electrical connection pad 106, 108 that are curved and of circular overall shape. Each flexible part 98 comprises, on its lower face 110, a third electrical connection pad 112 that is curved and of circular overall shape. These three electrical connection pads 106, 108, 112 make it possible to electrically interface the first printed circuit board 26 with other electrical elements of the device.

Figure 9:
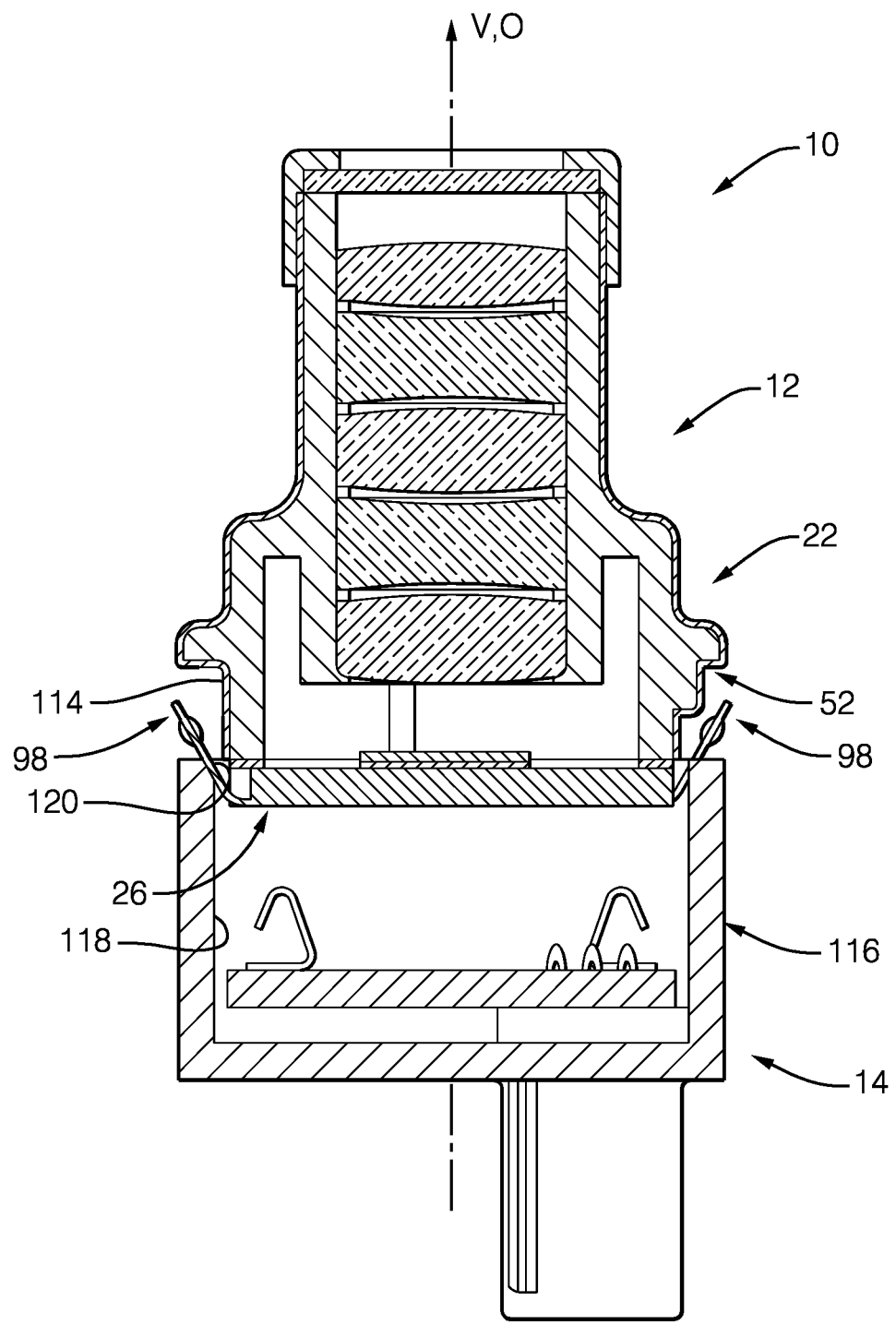
FIG. 9 is a schematic, perspective and cross-sectional view of an intermediate step of inserting the upper housing with the lower housing of the electronic housing assembly of FIG. 1.

In the embodiment shown in FIG. 9, when the upper housing 12 equipped with the first printed circuit board 26 is assembled with the lower housing 14, that is to say when the bottom portion 52 of the base 22 of the upper housing 12 is inserted into the lower housing 14, each flexible part 98 of the first printed circuit board 26 gradually bends until vertical, so as to be compressed and pinched between the outer surface 114 of the bottom portion 52 of the base 22 of the upper housing 12 and the inner surface 118 of the cylindrical wall 116 of the lower housing 14.

In order to avoid damaging each flexible part 98 of the first printed circuit board 26 during this assembly step, the top end 56 of the lower housing 14 comprises two inclined sloping edge 120, each forming a chamfer, that are oriented towards the inner surface 118 of the cylindrical wall 116 of the lower housing 14. Each inclined sloping edge 120 is positioned in the vertical alignment of each flexible part 98 of the first printed circuit board 26 so as, for example, to avoid shearing of each flexible part 98 during this assembly step.

Figure 10:
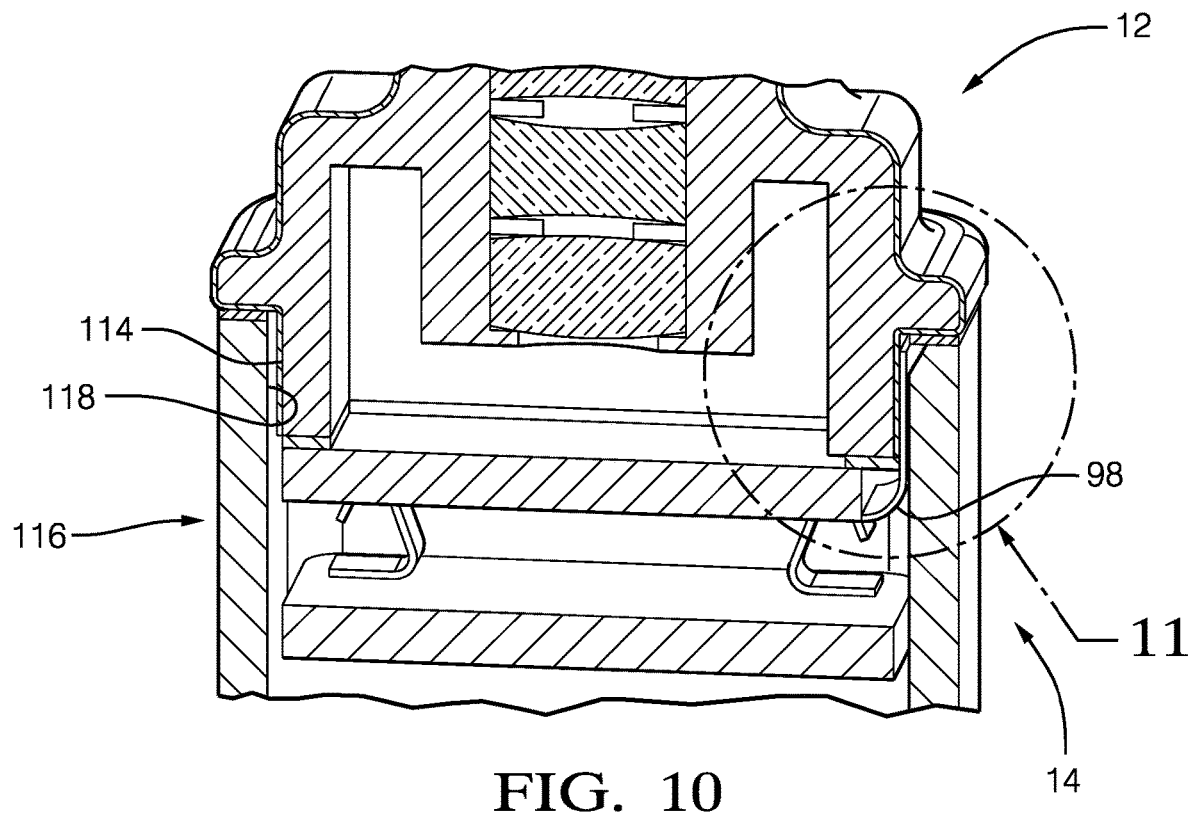
FIG. 10 is a schematic, partial, perspective and cross-sectional view of the electronic housing assembly of FIG. 1 in assembled form, illustrating the electrical link of the first printed circuit board to the upper housing and to the lower housing.
Figure 11:
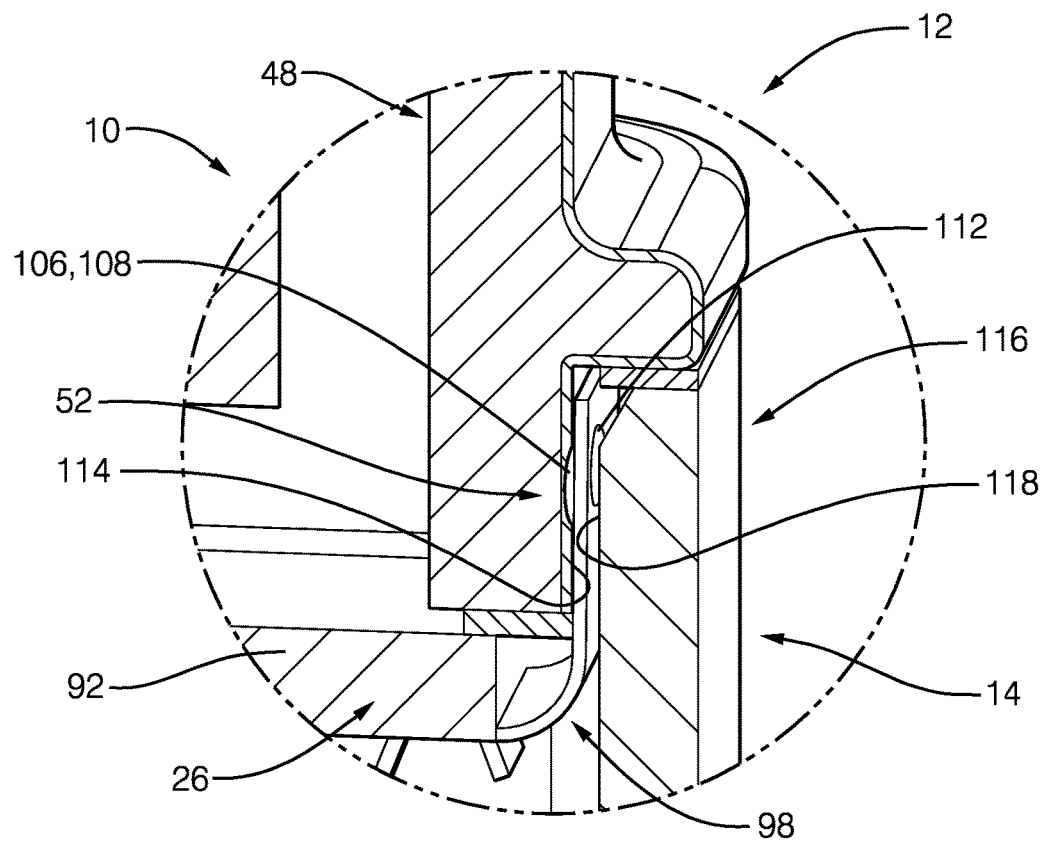
FIG. 11 is a schematic and enlarged view of FIG. 10 at the electrical link of the first printed circuit board to the upper housing and to the lower housing.

In FIG. 10 and FIG. 11, when the assembly of the upper housing 12 with the lower housing 14 has ended, each flexible part 98 is compressed and pinched between the outer surface 114 of the bottom portion 52 of the base 22 of the upper housing 12 and the inner surface 118 of the cylindrical wall 116 of the lower housing 14. Thus, the first and the second electrical connection pad 106, 108 of each flexible part 98 are in contact with the upper housing 12; the third electrical connection pad 112 of each flexible part 98 is in contact with the lower housing 14.

By way of example and in a nonlimiting manner, the inner surface 118 of the cylindrical wall 116 of the lower housing 14 is made of conductive metal, such that it has a flat electrical contact surface against which each third curved electrical connection pad 112 provides an electrical link to electrical ground.

Figure 12:
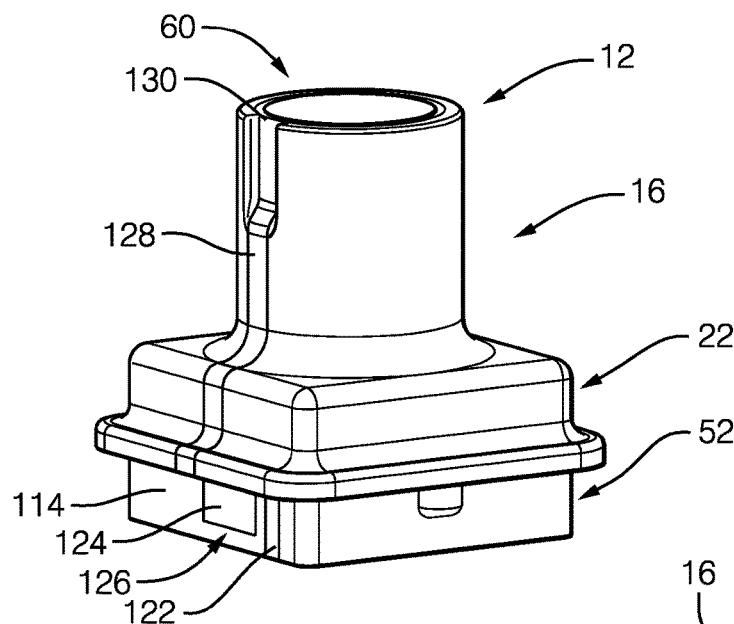
FIG. 12 is a schematic and perspective view of the upper housing equipped with electrically conductive traces.
Figure 13:
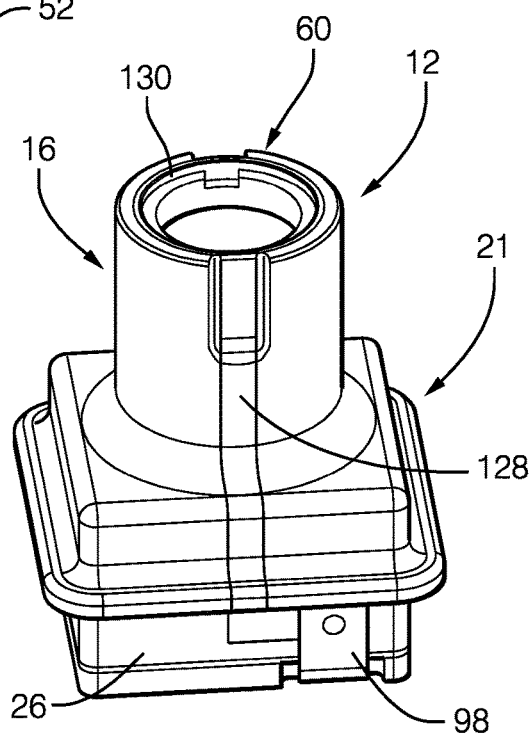
FIG. 13 is a schematic and perspective view of the upper housing equipped with electrically conductive traces and equipped with the first printed circuit board, the flexible parts of which board are shown in contact with the electrically conductive traces.

In the embodiment of FIG. 12 and FIG. 13, each first curved electrical connection pad 106 of each flexible part 98 of the first printed circuit board 26 is positioned against an electrical contact surface 122 integral with the upper housing 12 and positioned on the outer surface 114 of the bottom portion 52 of the base 22 of the upper housing 12, so as to link the upper housing 12 to the electrical ground of the electrical circuit comprising the first and the second printed circuit board 26, 40.

Each second curved electrical connection pad 108 of each flexible part 98 is positioned against a flat electrical contact surface 124 that is insulated electrically from the metal part of the upper housing 12 and positioned on the outer surface 114 of the bottom portion 52 of the base 22 of the upper housing 12.

Each electrical contact surface 124 that is electrically insulated from the metal part forms an electrical contact end 126 of an electrically conductive trace 128 extending from the contact end 126 as far as the second end 60 of the lens holder 16.

The second end 60 of the lens holder includes a heating element 130 that is supplied with electric power by the electrically conductive traces 128 that are linked electrically to the first printed circuit board 26 by each second curved electrical connection pad 108 of each flexible part 98 coming into contact with the contact ends 126.

Figure 14:
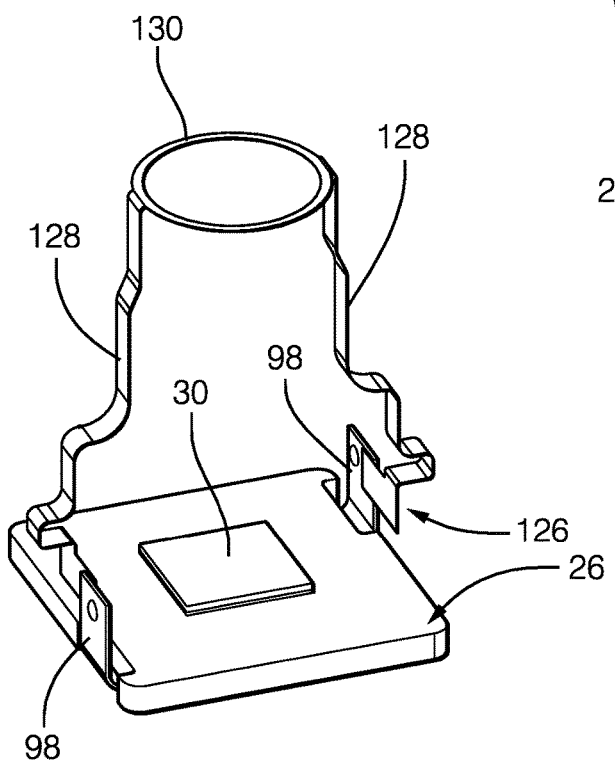
FIG. 14 is a schematic depiction of the heating element and of its electric power supply system.

In the embodiment shown in FIG. 13 and modelled in FIG. 14, the heating element 130 that is intended to defrost, if necessary, the protective outer lens 18 of the electronic housing assembly 10 is an annular conductive trace positioned on top of the second end 60 of the lens holder 16, so as to be in contact with the protective outer lens 18 of the electronic housing assembly 10. The conductive traces 128 may be produced, for example and in a nonlimiting manner, on an insulating layer that is deposited beforehand onto the outer surface of the upper housing 12. The conductive traces 128 may be produced by spraying conductive material, such as paint containing conductive microparticles, or else by electroplating.

As an alternative, the heating element 130 may be any other electrical device that generates heat. By way of example, the annular trace positioned on top of the second end of the lens holder 16 may be replaced with a seal of conductive adhesive, making it possible not only to hold the protective outer lens but also to heat the latter by allowing current to flow in the adhesive seal by way of the electrically conductive traces.

As an alternative, the electrically conductive traces 128 may supply power to any other type of electrical device, such as for example a wiping device or else a wiper for the protective pane.

In FIG. 14, the operating principle of the heating element 130 consists in making an electric current generated by the first printed circuit board 26 flow from the second curved electrical connection pad 108 of one of the flexible parts 98 of the first printed circuit board 26, through one of the conductive traces 128. The current that is generated continues its electrical path through the heating element 130 formed by the electrically conductive trace that is of annular shape and positioned on top of the tubular wall of the lens holder 16. The electric current finishes its journey to the first printed circuit board through the other conductive trace 128, the contact end 126 of which trace is in electrical contact with the second curved electrical connection pad 108 of the other flexible part 98.

The invention is not limited to the use of the flexible parts 98 of the first printed circuit board 26 as an electrical connection device for an optical device. Specifically, the use of a rigid-flex printed circuit board, comprising a rigid main part equipped with electronic components and also comprising a flexible part 98, equipped with at least one electrical connection pad 108, that is inserted in a manner compressed and pinched between a wall of an upper housing element and a wall of a lower housing element, so as to provide an electrical link from the rigid-flex printed circuit board to one or the other of the walls or to both walls, may be appropriate for any other electronic housing assembly requiring such a link.

FIG. 15, FIG. 16, FIG. 17 and FIG. 18 show four steps for producing protective layers of the electronic housing assembly 10. It is recalled that the electronic housing assembly forming the optical device is intended to be mounted outside a motor vehicle and therefore to be subjected to all of the environmental stresses outside the vehicle.

Figure 15:
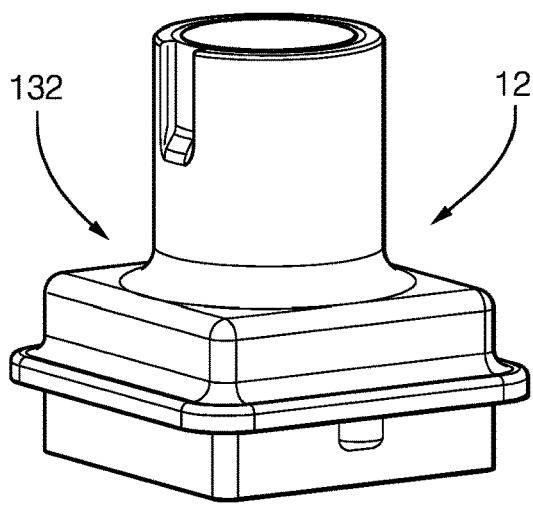
FIGS. 15, 16, 17 and 18 are schematic and perspective views of the upper housing in four steps for producing the conductive traces and the protective layers of the electronic housing assembly according to the invention.

In FIG. 15, the upper housing 12 is a housing comprising an outer surface made of metal, such as for example an aluminium alloy.

Figure 16:
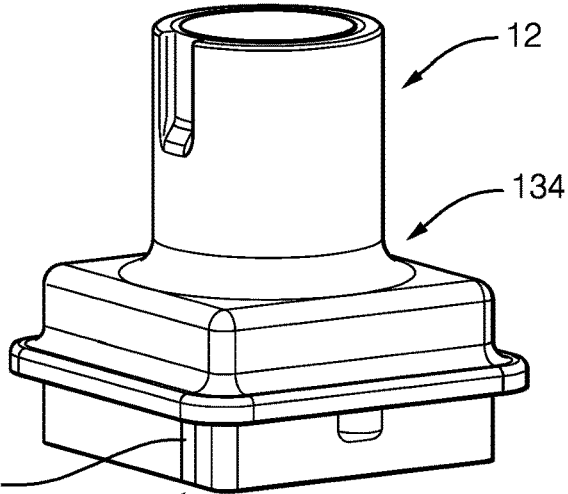

In FIG. 16, the metal outer surface 132 of the upper housing 12 is covered entirely by a first electrically insulating layer 134. Only two flat electrical contact surfaces 136 (only one of which is visible) or metal contact areas are not covered by the first electrically insulating layer 134. These flat electrical contact surfaces 136 are integral with the metal surface 132 of the upper housing 12. These contact areas are intended to link the upper housing 12 to the electrical ground of the electrical circuit formed by the first and the second printed circuit board 26, 40 by way of the two flexible parts 98 of the first printed circuit board 26.

Figure 17:
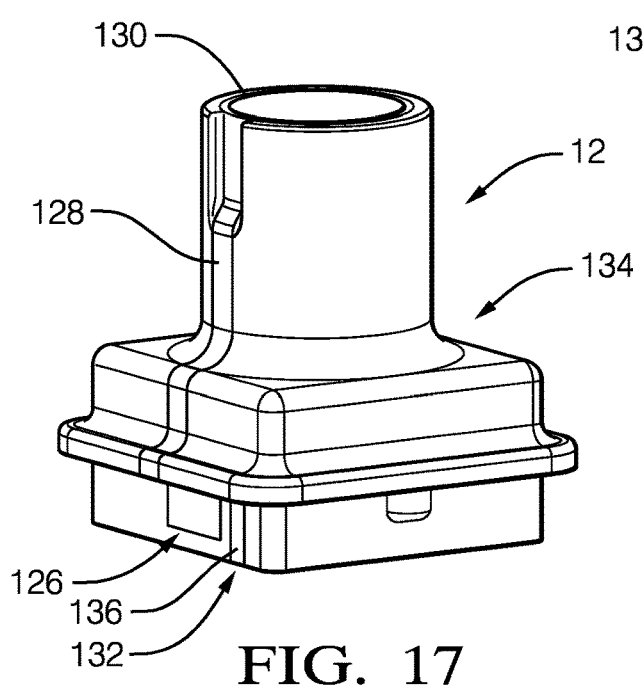

In FIG. 17, the two electrically conductive traces 128 (only one of which is visible) that are linked to the heating element 130 and the annular electrical trace, performing the role of heating element 130 and positioned on top of the second end 60 of the lens holder 16, are produced on top of the first electrically insulating layer 134.

Figure 18:
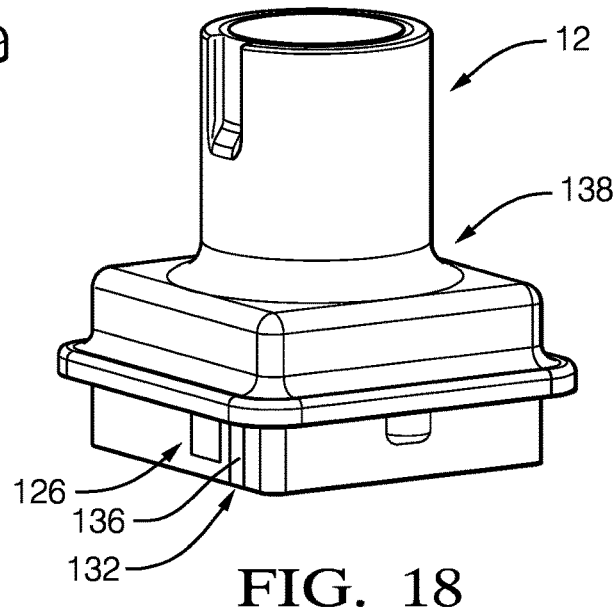

In FIG. 18, a second electrically insulating layer 138, such as a varnish, entirely covers the electrically conductive traces 128 and also the first electrically insulating layer 134, except for the contact ends 126 of the electrically conductive traces 128 and except for the two flat electrical contact surfaces 136.

One alternative consists in the first electrically insulating layer 134 and the second electrically insulating layer 138 entirely covering the metal outer surface 132 of the upper housing 12, the electrically conductive traces 128 still being produced between the two electrically insulating layers 134, 138, and then in an operation of locally removing the electrically insulating layers 134, 138, carried out by way of a laser beam, making it possible to reveal the flat contact surfaces 136 of the metal housing 132 and the contact ends 126 of the electrically conductive traces 128.

In FIG. 19, a method for assembling the electronic housing assembly 10, described through the invention and shown in FIG. 20, may in particular comprise the following steps.

One step consists in inserting, into the housing bottom 32, the second printed circuit board 40 that is equipped beforehand with the set of electrical terminals 38, the electrical contacts 76 of which terminals have been forcibly inserted into the second printed circuit board 40. During this step, the body of the connector 36 serves as a guide for inserting the second printed circuit board 40 until the second printed circuit board 40 comes into abutment on the inner cylindrical wall 86 of the lower housing 14.

Another step then consists in arranging the second adhesive seal 44 on the upper surface of the top end 56 of the lower housing 14.

Another step then consists in sliding and inserting the bottom portion 52 of the base 22 of the upper housing 12 into the lower housing 14 until the cylindrical rim 46 comes into abutment against the second adhesive seal 44. It should be noted that the first printed circuit board 26 has been assembled beforehand on the bottom end of the upper housing 12, such that the flexible parts 98 of the first printed circuit board 26 will first of all bend in the vertical direction and then position themselves in a manner pinched between the outer surface 114 of the cylindrical wall 48 of the bottom portion 52 of the base 22 of the upper housing 12 and the inner surface 118 of the cylindrical wall 116 of the lower housing 14 during assembly.

We claim:

1. An electronic housing assembly comprising:
    a printed circuit board comprising a rigid main part, at least one face of which part includes an electronic component, and comprising at least one flexible part extending outward from a periphery of the rigid part, the flexible part comprising at least one electrical connection pad located at a distal end of the flexible part;
    an upper housing element comprising a first cylindrical wall that is inserted into a lower housing element comprising a second cylindrical wall; wherein
    the flexible part is disposed between the first and the second cylindrical walls, and wherein the electrical connection pad of the flexible part is in electrical contact with an electrical contact surface that is positioned on the outer face of the first cylindrical wall.

2. The electronic housing assembly according to claim 1, wherein
    the flexible part is formed by a flexible tab that extends overall in the plane of the main part of the printed circuit board before mounting of the printed circuit board in the electronic housing assembly.

3. The electronic housing assembly according to claim 1, wherein
    the flexible part is formed by a thinned part of the substrate that forms the main part of the printed circuit board.

4. The electronic housing assembly according to claim 1, wherein
    the main part of the printed circuit board is attached to a free end edge of the first cylindrical wall and extends in a plane substantially transverse to the vertical axis of the first cylindrical wall.

5. The electronic housing assembly according to claim 1, wherein
    the first and the second cylindrical walls each include at least one substantially flat electrical contact surface and in that the flexible part is held in a manner pinched between said flat contact surfaces.

6. The electronic housing assembly according to claim 1, wherein
    the electrical connection pad of the flexible part is curved in form, so as to reinforce the electrical contact between the electrical connection pad of the flexible part and the electrical contact surface of the associated cylindrical wall.

7. The electronic housing assembly according to claim 1, wherein
the upper housing element includes a lens holder, and in that the main part of the printed circuit board includes an electronic image-capturing circuit.

8. The electronic housing assembly according to claim 7, wherein
the electrical contact surface that is positioned on the outer face of the first cylindrical wall is linked electrically to an electrical device, such as a heating device, that is positioned on the lens holder.

9. The electronic housing assembly according to claim 1, wherein the electrical connection pad of the flexible part is in electrical contact with an electrical contact surface that is positioned on the inner face of the second cylindrical wall.

10. A method for assembling an electronic housing assembly, said method comprising:
providing a printed circuit board comprising a rigid main part and comprising at least one flexible part extending outward from a periphery of the rigid part;
attaching the main part of the printed circuit board to a free end edge of the first cylindrical wall of an upper housing element in a plane substantially transverse to the axis of the first cylindrical wall;
sliding the first cylindrical wall into a lower housing element and against the second cylindrical wall of the lower housing element, so as to bend the flexible part vertically; and
inserting the first cylindrical wall into the lower housing element and against the second cylindrical wall of the lower housing element, so as to dispose the flexible part between the first and the second cylindrical walls; wherein
the electrical connection pad of the flexible part is in electrical contact with an electrical contact surface that is positioned on the outer face of the first cylindrical wall.

11. The method according to claim 10, wherein the electrical connection pad of the flexible part is in electrical contact with an electrical contact surface that is positioned on the inner face of the second cylindrical wall.

12. The method according to claim 10, wherein the flexible part is formed by a flexible tab that extends overall in the plane of the main part of the printed circuit board before mounting of the printed circuit board in the electronic housing assembly.

13. The method according to claim 10, wherein the flexible part is formed by a thinned part of the substrate that forms the main part of the printed circuit board.

14. The method according to claim 10, wherein the main part of the printed circuit board is attached to a free end edge of the first cylindrical wall and extends in a plane substantially transverse to the vertical axis of the first cylindrical wall.

15. The method according to claim 10, wherein the first and the second cylindrical walls each include at least one substantially flat electrical contact surface and in that the flexible part is held in a manner pinched between said flat contact surfaces.

16. The method according to claim 10, wherein the electrical connection pad of the flexible part is curved in form, so as to reinforce the electrical contact between the electrical connection pad of the flexible part and the electrical contact surface of the associated cylindrical wall.

17. The method according to claim 10, wherein the upper housing element includes a lens holder, and in that the main part of the printed circuit board includes an electronic image-capturing circuit.

18. The method according to claim 10, wherein the electrical contact surface that is positioned on the outer face of the first cylindrical wall is linked electrically to an electrical device, such as a heating device, that is positioned on the lens holder.

19. An electronic housing assembly comprising:
a printed circuit board comprising a rigid main part, at least one face of which part includes an electronic component, and comprising at least one flexible part positioned at the periphery of the rigid part, the flexible part comprising at least one electrical connection pad;
an upper housing element comprising a first cylindrical wall that is inserted into a lower housing element comprising a second cylindrical wall; wherein
the flexible part extends between the first and the second cylindrical walls, and wherein the electrical connection pad of the flexible part is in electrical contact with an electrical contact surface that is positioned on the outer face of the first cylindrical wall or on the inner face of the second cylindrical wall; wherein
the second cylindrical walls each include at least one substantially flat electrical contact surface and in that the flexible part is held in a manner pinched between said flat contact surfaces.

20. An electronic housing assembly comprising:
a printed circuit board comprising a rigid main part, at least one face of which part includes an electronic component, and comprising at least one flexible part positioned at the periphery of the rigid part, the flexible part comprising at least one electrical connection pad;
an upper housing element comprising a first cylindrical wall that is inserted into a lower housing element comprising a second cylindrical wall; wherein
the flexible part extends between the first and the second cylindrical walls, and wherein the electrical connection pad of the flexible part is in electrical contact with an electrical contact surface that is positioned on the outer face of the first cylindrical wall or on the inner face of the second cylindrical wall; wherein
the electrical connection pad of the flexible part is curved in form, so as to reinforce the electrical contact between the electrical connection pad of the flexible part and the electrical contact surface of the associated cylindrical wall.

* * * * *